(12) United States Patent  (10) Patent No.: US 8,952,246 B2
Briceno et al.  (45) Date of Patent: Feb. 10, 2015

(54) SINGLE-PIECE PHOTOVOLTAIC STRUCTURE

(71) Applicant: Nusola, Inc., Scottsdale, AZ (US)

(72) Inventors: Jose Briceno, Ohta-ku (JP); Koji Matsumaru, Niigata-Ken (JP)

(73) Assignee: Nusola, Inc., Scottsdale, AZ (US)

( * ) Notice: Subject to any disclaimer, the term of this patent is extended or adjusted under 35 U.S.C. 154(b) by 5 days.

(21) Appl. No.: 13/844,298

(22) Filed: Mar. 15, 2013

(65) Prior Publication Data

US 2013/0256662 A1  Oct. 3, 2013

Related U.S. Application Data

(60) Provisional application No. 61/619,410, filed on Apr. 2, 2012.

(51) Int. Cl.
| | |
|---|---|
| H01L 31/00 | (2006.01) |
| H01L 31/18 | (2006.01) |
| H01L 31/0376 | (2006.01) |
| H01L 31/02 | (2006.01) |
| H01L 21/02 | (2006.01) |
| H01L 31/028 | (2006.01) |
| H01L 31/036 | (2006.01) |
| H01L 31/0747 | (2012.01) |

(52) U.S. Cl.
CPC ...... *H01L 31/1872* (2013.01); *H01L 31/03762* (2013.01); *H01L 31/02021* (2013.01); *H01L 31/02002* (2013.01); *H01L 21/02667* (2013.01); *H01L 31/0284* (2013.01); *H01L 31/036* (2013.01); *H01L 31/0747* (2013.01); *Y02E 10/50* (2013.01)
USPC ............................. 136/256; 136/243; 257/53

(58) Field of Classification Search
CPC .................. H01L 31/02021; H01L 31/02002; H01L 31/036
USPC ...................................... 136/243, 256; 257/53
See application file for complete search history.

(56) References Cited

U.S. PATENT DOCUMENTS

| | | | |
|---|---|---|---|
| 4,072,541 | A | 2/1978 | Meulenberg et al. |
| 4,167,015 | A | 9/1979 | Hanak |
| 5,286,306 | A | 2/1994 | Menezes |
| 2006/0231802 | A1 | 10/2006 | Konno |
| 2010/0032008 | A1* | 2/2010 | Adekore ............... 136/255 |
| 2011/0088760 | A1 | 4/2011 | Sheng et al. |
| 2011/0197960 | A1 | 8/2011 | Pham et al. |

(Continued)

*Primary Examiner* — David Vu
*Assistant Examiner* — Brandon Fox
(74) *Attorney, Agent, or Firm* — Robert D. Becker; Manatt, Phelps & Phillips, LLP

(57) ABSTRACT

A material is manufactured from a single piece of semiconductor material. The semiconductor material can be an n-type semiconductor. Such a manufactured material may have a top layer with a crystalline structure, transitioning into a transition layer, further transitioning into an intermediate layer, and further transitioning to the bulk substrate layer. The orientation of the crystalline pores of the crystalline structure align in layers of the material. The transition layer or intermediate layer includes a material that is substantially equivalent to intrinsic semiconductor. Also described is a method for manufacturing a material from a single piece of semiconductor material by exposing a top surface to an energy source until the transformation of the top surface occurs, while the bulk of the material remains unaltered. The material may exhibit photovoltaic properties.

23 Claims, 9 Drawing Sheets

(56) References Cited

U.S. PATENT DOCUMENTS

2012/0049242 A1 3/2012 Atanackovic et al.
2012/0318347 A1 12/2012 Junghanel et al.

* cited by examiner (NOT TO SCALE)

SINGLE-PIECE PHOTOVOLTAIC STRUCTURE

CROSS REFERENCE TO RELATED APPLICATIONS

This application claims priority to U.S. Provisional Patent Application No. 61/619,410, entitled "Single-Piece Photovolatic Structure," filed on Apr. 2, 2012, the entirety of which is incorporated by reference as if fully set forth herein.

FIELD OF THE INVENTION

The present invention relates to manufacturing photovoltaic materials from a semiconductor material, and in particular, a new material manufactured from a single piece of semiconductor material.

BACKGROUND OF THE INVENTION

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

Conventional methods for manufacturing photovoltaic materials typically requires some additives to a semiconductor. Such additives, including gallium arsenide (GaAs), can be highly toxic and carcinogenic, and their use in the manufacturing process of photovoltaic materials can increase the risk of negative health and environmental effects. It is highly desirable to have a manufacturing process of photovoltaic material with reduced use of additives.

The conventional methods for manufacturing photovoltaic materials also require a multi-step process, or different processes, with each step possibly taking place at a different apparatus and at different times, and requiring its own management and resources. For instance, different doping processes are applied to manufacture different semiconductor wafers, and the wafers of different types are sealed together in a particular way to form a photovoltaic material. The purpose for the doping processes and assembly of the wafers is to create p-n junctions, or p-i-n junctions, in between wafers to achieve an overall photovoltaic effect in the assembled material. Each of such manufacturing stages incurs a cost. It is highly desirable to have a manufacturing process for photovoltaic material that reduces the number of necessary processes or steps to reduce costs.

BRIEF SUMMARY OF PREFERRED EMBODIMENTS OF THE INVENTION

A new material manufactured from a single piece of semiconductor material is described. Techniques are provided for manufacturing a new material from a single piece of semiconductor material. In some embodiments, the manufacture of the material does not require multiple uses of toxic additives and doping processes, and does not require the assembly of different types semiconductor wafers in multiple steps and processes.

BRIEF DESCRIPTION OF THE DRAWINGS

Preferred embodiments of the present invention is illustrated by way of example, and not by way of limitation, in the figures of the accompanying drawings and in which like reference numerals refer to similar elements and in which:

FIG. 2 (c) is a block diagram and photograph as seen through a scanning electron microscope showing the distribution of crystalline structures in the new material manufactured from a semiconductor material, according to one embodiment of the invention.

DETAILED DESCRIPTION OF PREFERRED EMBODIMENTS OF THE INVENTION

Figure 1:
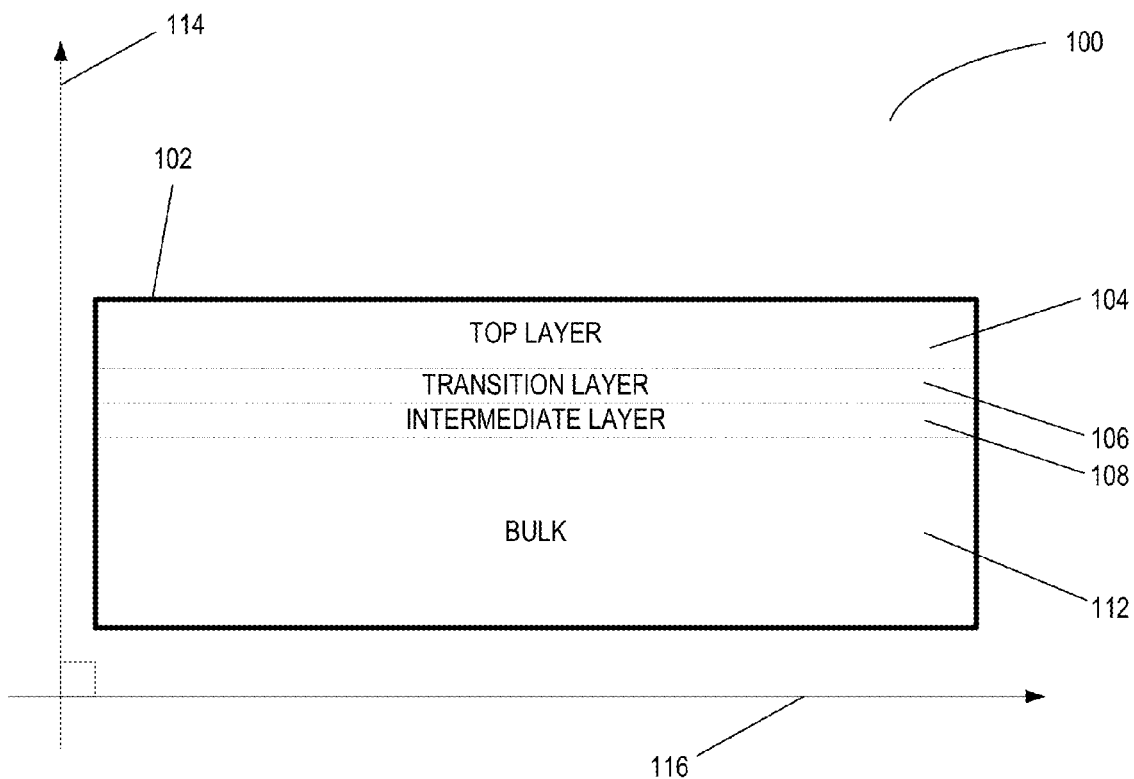
FIG. 1 is a block diagram that illustrates a cross-section of a new material manufactured from a semiconductor material, according to one embodiment of the invention.

In accordance with one embodiment of the invention, FIG. 1 illustrates a cross-section of a new material 100 manufactured from a semiconductor material. The new material 100 comprises a top surface 102 of a top layer 104, a transition layer 106 into an intermediate layer 108, and a bulk layer 112. While the layers 104, 106, 108, and 112 as shown in FIG. 1 appear to be uniform and with discrete boundaries, the layers may have varying dimensions and shapes.

The new material is manufactured from a semiconductor material. While silicon is the example of a semiconductor material used in the following descriptions, other semiconductor material can be used as a substrate to manufacture the new material. For example, any semiconductor material having some dopant can be used as a substrate. In one embodiment, the semiconductor material is an n-type or a p-type silicon wafer such as the type commonly used for manufacturing of semiconductors. In one example, the n-type silicon wafer contains a concentration of phosphorus between 1E+11 and 1E+17 atoms/cc, although other dopants may be used to create such n-type or p-type semiconductor without departing from the spirit of preferred embodiments of the invention. In this example, the silicon wafer is cut from a piece of single-crystalline silicon, and a dopant is added to create an n-type silicon wafer from the single-crystalline silicon. Other examples of semiconductor material used in some embodiments include germanium or compound semiconductors. In some embodiments, poly-crystalline semiconductor or amorphous semiconductor is used as a substrate.

In an embodiment, the silicon wafer used to manufacture the new material has a thickness of approximately 1 μm, although silicon wafers having a thickness of more than 1 μm can also be used to manufacture the new material. In one embodiment, the top layer 104 has a thickness of approximately 0.1 to 10 μm.

After the silicon material is manufactured into the new material 100, the top layer 104 has a particular structure that can be observed at top surface 102. In one embodiment, a crystalline structure, or a composite of a crystalline structure and a glassy, amorphous material, is distributed across the top surface 102, as well as within the top layer 104.

Figure 2A:
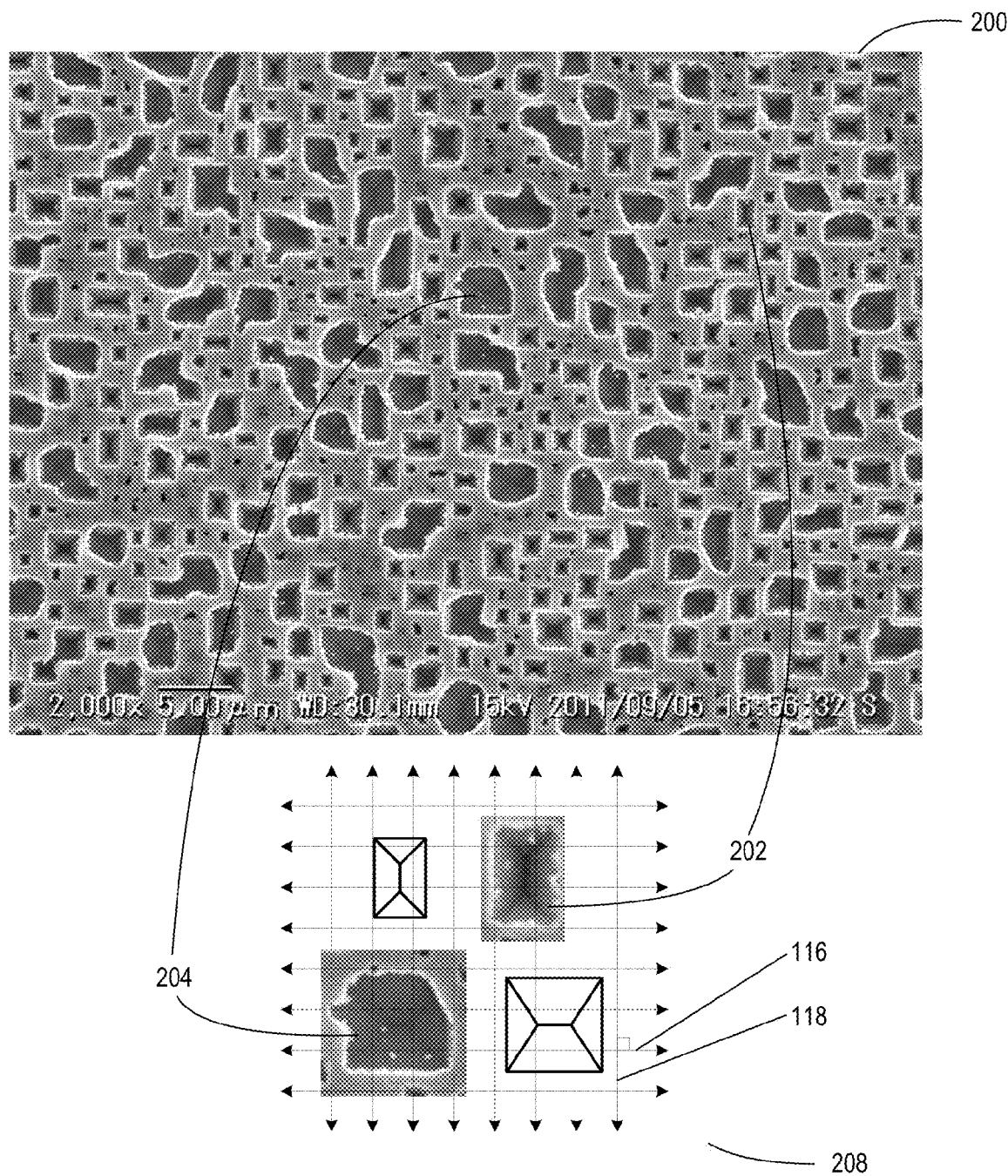
FIG. 2 (a) and FIG. 2 (b) are photographs showing the top surface of a new material manufactured from a semiconductor material as seen through a scanning electron microscope, and a diagram showing the coherent orientation of the base crystalline structures that are distributed across the top surface of the new material, according to one embodiment of the invention.
Figure 2B:
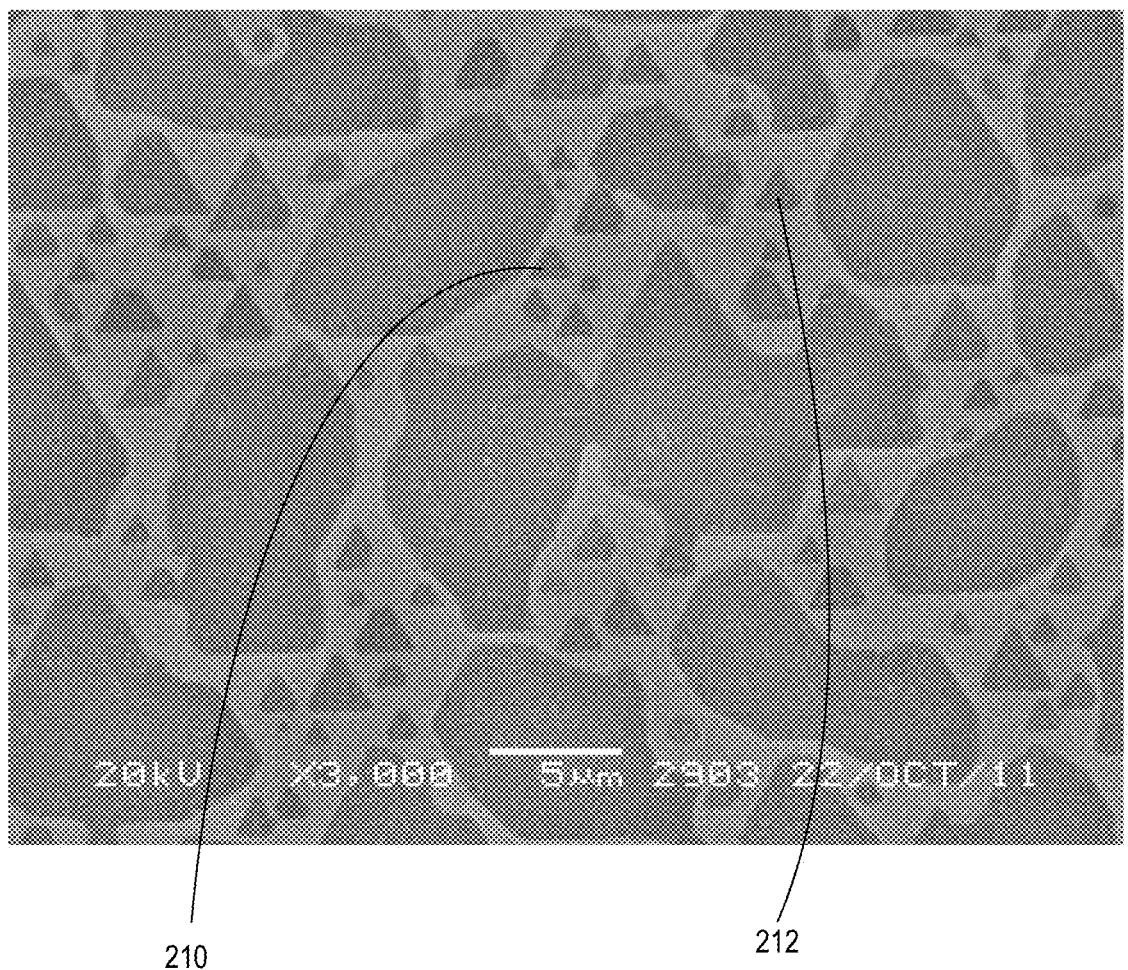

FIG. 2(a) and FIG. 2(b) are photographs showing the top surface of the new material manufactured from a semiconductor material as seen through a scanning electron microscope according to embodiments of the invention. In FIG. 2(a), the new material according to one embodiment of the invention is shown as top-down view 200 of top surface 102. View 200 shows that certain crystals or crystalline pores within top layer 104 have a coherent orientation of the base crystalline structure. View 200 further shows the orientation of the crystals or crystalline pores by showing the edges of the faces of the pore walls in apparent alignment with the crystalline orientation of the bulk 112. For example, crystalline pore 202 and crystalline pore 204 are magnified and shown against grid overlay 208. The facet edges of crystalline pore 202 and crystalline pore 204, as shown in FIG. 2(a), are aligned at right-angles to each other, and show the same crystalline orientation of the single-crystalline bulk 112. For example, as shown in FIG. 2(a), the crystalline orientation of bulk 112 has a Miller index <100>. In FIG. 2(b), the new material has crystalline pore 210 and crystalline pore 212, which are at a 60-degree orientation to each other. The pyramidal shape of the crystalline pores corresponds with bulk 112 having the crystalline orientation of Miller index <111>. Further, with reference to FIG. 2(a) and FIG. 2(b), the crystalline pores shown are aligned along dimensions 116 and 118 to allow the same type of facets or facet edges to be observed when viewed from the top surface 102.

Figure 2C:
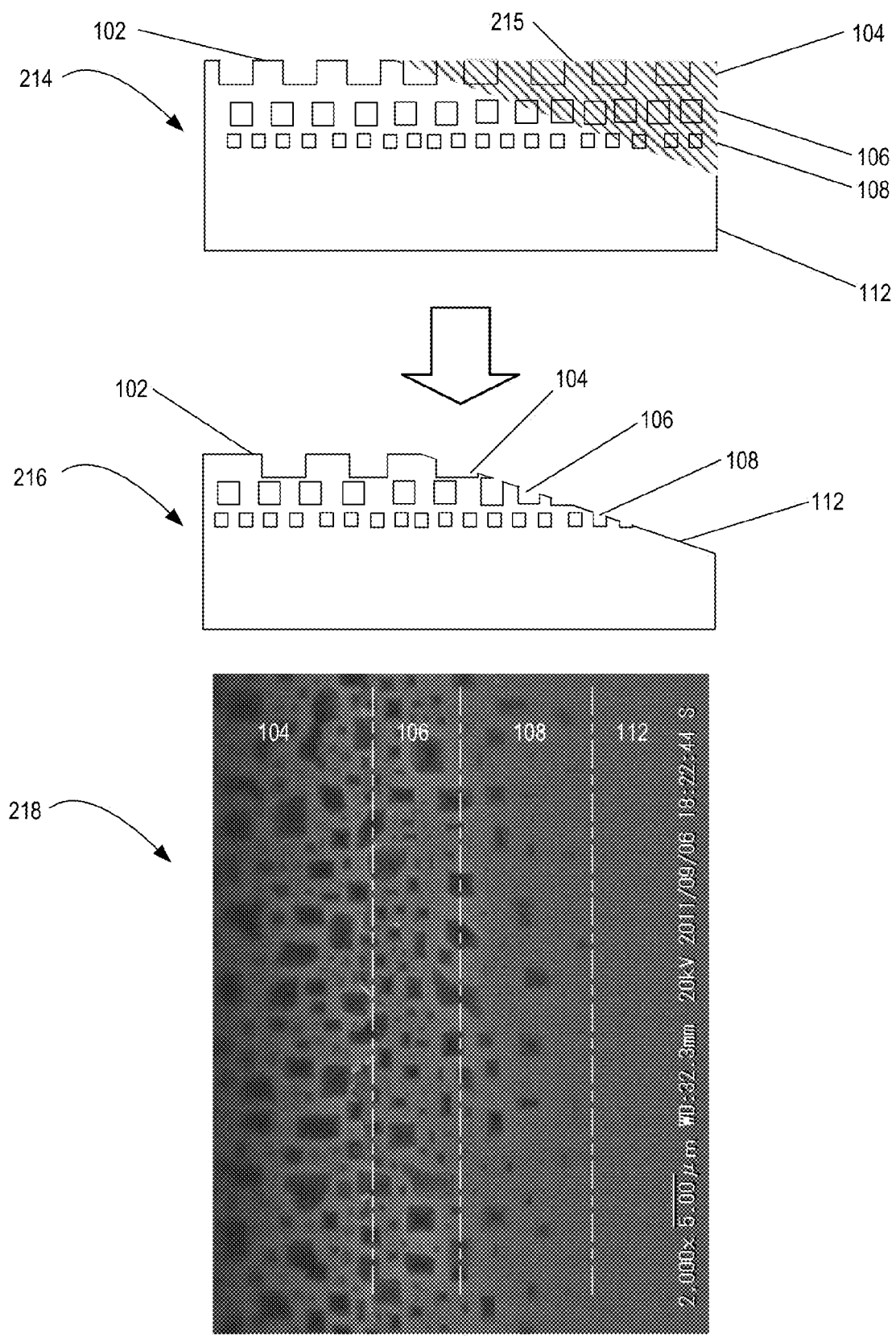

FIG. 2(c) is a block diagram and photograph that illustrates the distribution and size of the crystalline pores throughout the new material manufactured from a semiconductor material according to one embodiment of the invention. Cross-section 214 illustrates the distribution of the crystalline pores in each of top layer 104, transition layer 106, and intermediate layer 108. In one embodiment, these crystalline structures are observed by removing portion 215 from the material, as shown in sloped cross-section 216. With portion 215 removed, each of the top layer 104, transition layer 106, intermediate layer 108 and bulk layer 112 is visible in a top view.

Spreading resistance analysis (SRA) of the layers 104, 106, 108, and 112 can be performed on the new material 216 with portion 215 removed to determine the characteristics of each of layers 104, 106, 108, and 112. In some embodiments, SRA of the layers will show different electrical resistivity for at least two of the layers 104, 106, 108 and 112. For example, each of layers 104, 106, 108 and 112 will have different ranges of resistivity. Image 218 is a top view of the material with a sloped portion 215 removed to show each of the layers 104, 106, 108, and 112 in a top view through a scanning electron microscope, according to one embodiment of the invention. As shown in FIG. 2(c), the top surface 102 has a porous surface. In some embodiments of the invention, the top surface 102 has few or no pores. For example, top surface 102 is a thin layer of semiconductor material without pores, and the pores of layer 104 are beneath the surface 102.

In further reference to FIG. 1, in one embodiment, a gradient in the distribution of crystalline pores is observed in the top layer 104, transition layer 106, intermediate layer 108. In this example, the distribution of larger pores increases with proximity to the top surface 102. In other embodiments, the distribution of the crystalline pores is substantially uniform throughout layers 104 and 106 until the intermediate layer 108. In one embodiment, some or all of the material between the crystalline pores in each of layers 104, 106 and 108 has the coherent single-crystal structure of bulk 112.

In some embodiments, intermediate layer 108 is composed of silicon characterized by having little or no dopant impurities, and therefore has different characteristics from an n-type semiconductor. In one embodiment, the intermediate layer 108 approximates or is substantially equivalent to intrinsic silicon. In one embodiment, the transition layers 106 and intermediate layer 108 contain the coherent crystal structure of the underlying bulk layer 112 of n-type silicon.

In one embodiment, transition layer 106 has the same properties of top layer 104. While shown in FIG. 1 as having a uniform thickness and assuming the shape of a flat plane, transition layer 106 has a thickness that is not necessarily uniform, and is not necessarily configured as a flat plane. In an embodiment, the thickness of transition 106 is no more than 1 µm.

In one embodiment, intermediate layer 108 has properties of each of top layer 104, transition layer 106 and bulk layer 112. In an embodiment, the thickness of intermediate layer 108 is no more than 5 µm.

While shown in FIG. 1 as having a uniform thickness and assuming the shape of a flat plane, intermediate layer 108 has a thickness that is not necessarily uniform, and is not necessarily configured as a flat plane. In one embodiment, intermediate layer 108 marks the boundary between the transition layer 106 and bulk layer 112, and has little or no thickness. In some embodiments, the thickness of the intermediate layer 108 is no more than 3 µm.

The bulk layer 112 is the non-transformed portion of the semiconductor material from which the new material 100 is manufactured. Accordingly, the bulk layer 112 has the identical properties of the source semiconductor substrate. In one embodiment, the bulk layer 112 is single-crystalline n-type silicon. In an embodiment, bulk layer 112 contains a concentration of phosphorous between 1E+11 and 1E+17 atoms/cc, although other dopants may be used to create such n-type semiconductor without departing from the spirit of preferred embodiments of the invention. In an embodiment, p-type semiconductor will also show same properties as n-type semiconductor.

Figure 3:
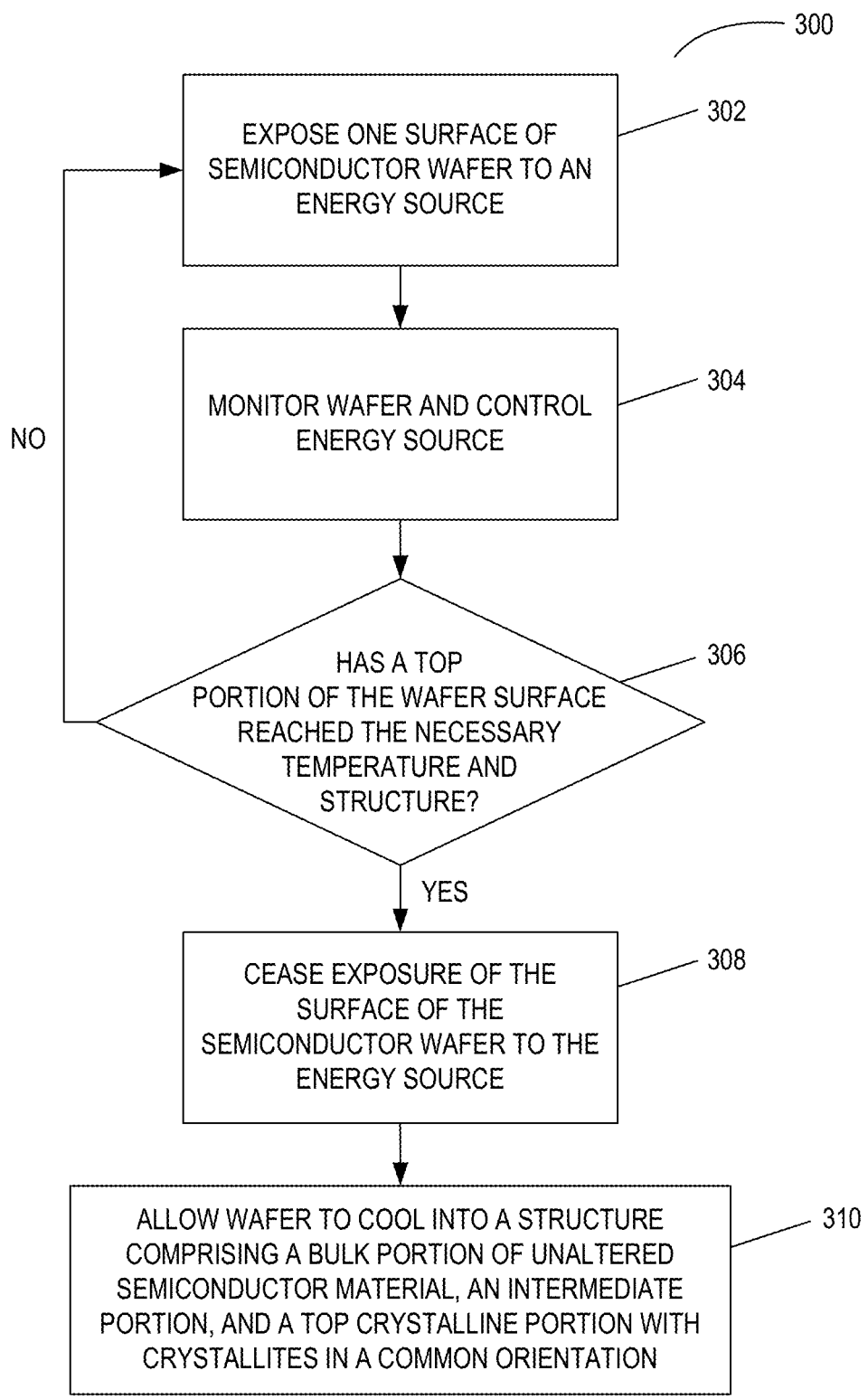
FIGS. 3 & 4 are flow diagrams that illustrate sample processes by which a new material is manufactured from a semiconductor material, according to one embodiment of the invention.

FIG. 3 illustrates one example of a process 300 for manufacturing new material 100, according to one embodiment of the invention. At step 302, one surface of a semiconductor wafer is exposed to an energy source. Examples of energy sources include a heat source or a laser source. One example of a heat source is a lamp furnace, although other furnace types may be used to provide the necessary energy source. The amount of energy transferred to the semiconductor wafer is sufficient to increase temperature of at least the top surface and a top portion of the semiconductor wafer. In one embodiment, the top portion has a temperature over 800 K. In one embodiment, the semiconductor wafer is an n-type semiconductor. In one embodiment, p-type semiconductor will also show same behavior as n-type semiconductor. In one embodiment, the semiconductor wafer is n-type silicon. In one embodiment, the n-type silicon contains a certain concentration of phosphorus added to a single-crystalline silicon wafer as a dopant. In one embodiment, the concentration of phosphorus in the silicon is between 1E+11 and 1E+17 atoms/cc.

At step 304, during the exposure to the energy source, the semiconductor wafer is monitored. To achieve the structure of the new material, a portion of the semiconductor wafer must not undergo any phase transformation. In an embodiment, the portion not undergoing any phase transformation is the bottom of the wafer, located opposite the side of the semiconductor wafer exposed to the energy source. Accordingly, in one embodiment, the semiconductor wafer is monitored to detect when the top portion of the wafer has reached the desired phase and temperature without transforming the phase or structure of the bulk bottom portion of the semiconductor wafer. The energy source may be controlled to maintain the optimal exposure of the energy to the wafer.

At step 306, it is determined whether the top portion of the wafer has reached the necessary phase, or temperature, or both. If not, the exposure to the energy source continues. If the top portion of the wafer has reached the necessary phase, or temperature, or both, the exposure to the energy source is ceased at step 308.

At step 310, the wafer is allowed to cool. The resulting structure after the cooling is completed is the structure of the new material 100 as described with reference to FIG. 1 and example embodiments illustrated in FIGS. 2(a) and 2(b).

In some embodiments, the new material 100 is created after one iteration or pass of process 300. In some embodiments, the new material 100 is created from one silicon wafer after one transformative process is performed on the silicon wafer.

Figure 4:
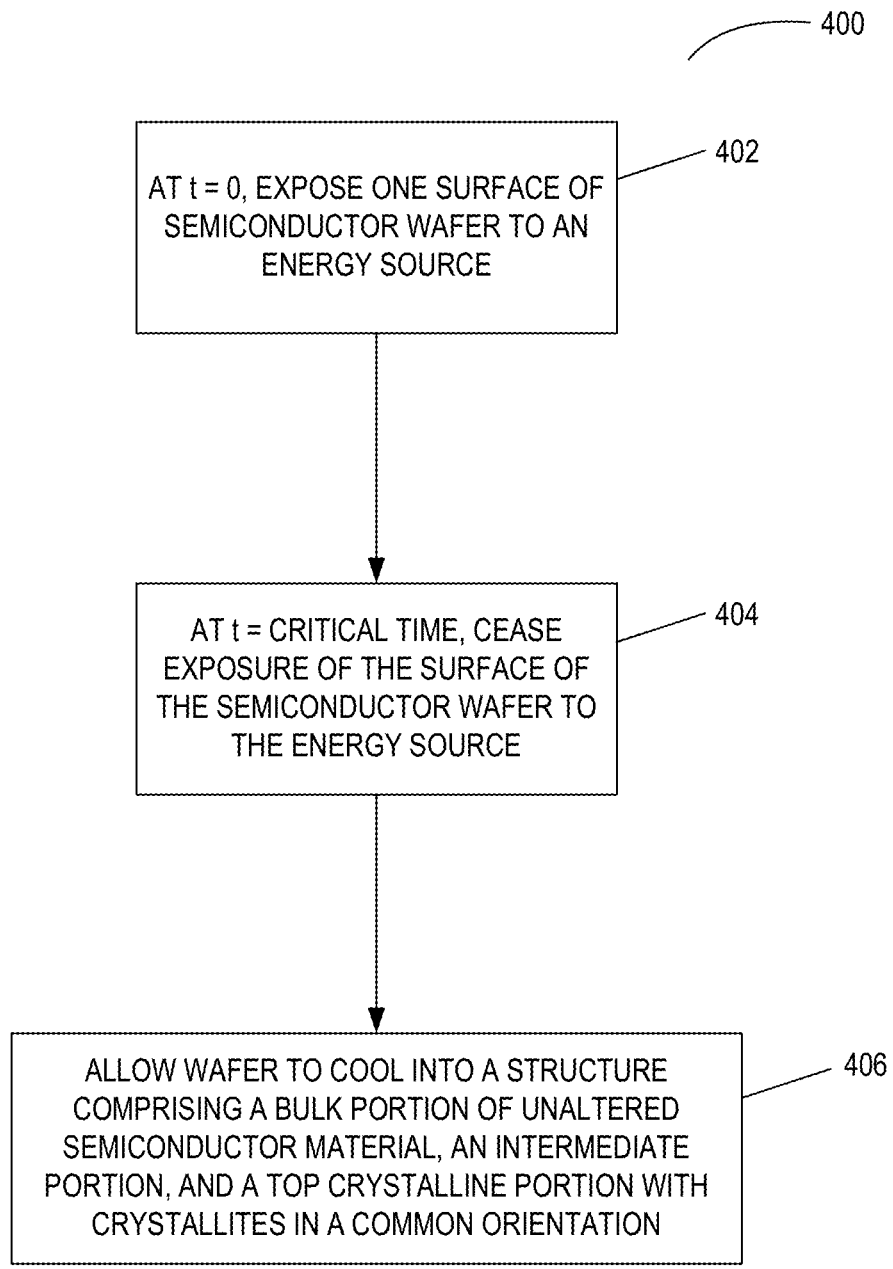

FIG. 4 illustrates one example of a time-controlled process 400 for manufacturing new material 100, according to one embodiment of the invention. At step 402, one surface of a semiconductor wafer is exposed to an energy source at time t=0. At step 404, exposure of the semiconductor wafer to the energy source is ceased at a critical time t. According to one embodiment, at critical time t, a top portion of the silicon wafer has transformed, while a bottom portion remains unaltered. In one embodiment, t is determined based on the temperature of the heat source, the distance between the heat source and the surface of the semiconductor, and the thickness of the semiconductor wafer. Table 1 contains examples of possible combinations of heat source power, bulk temperature, distance, and thickness, atmosphere, and treatment time used in process 400 to manufacture new material 100.

TABLE 1

| Heat Source Power (kW) | Bulk Temperature (K) | Distance (mm) | Thickness (μm) | Atmosphere | Treatment Time (min) |
|---|---|---|---|---|---|
| 4 | 800 | 30 | 600 | Argon 15 Pa | 60 |
| 4 | 850 | 30 | 700 | Argon 15 Pa | 80 |

At step 406, the wafer is allowed to cool. The resulting structure after the cooling is completed is the structure of the new material 100 as described with reference to FIG. 1 and example embodiments illustrated in FIGS. 2(a) and 2(b).

Figure 5:
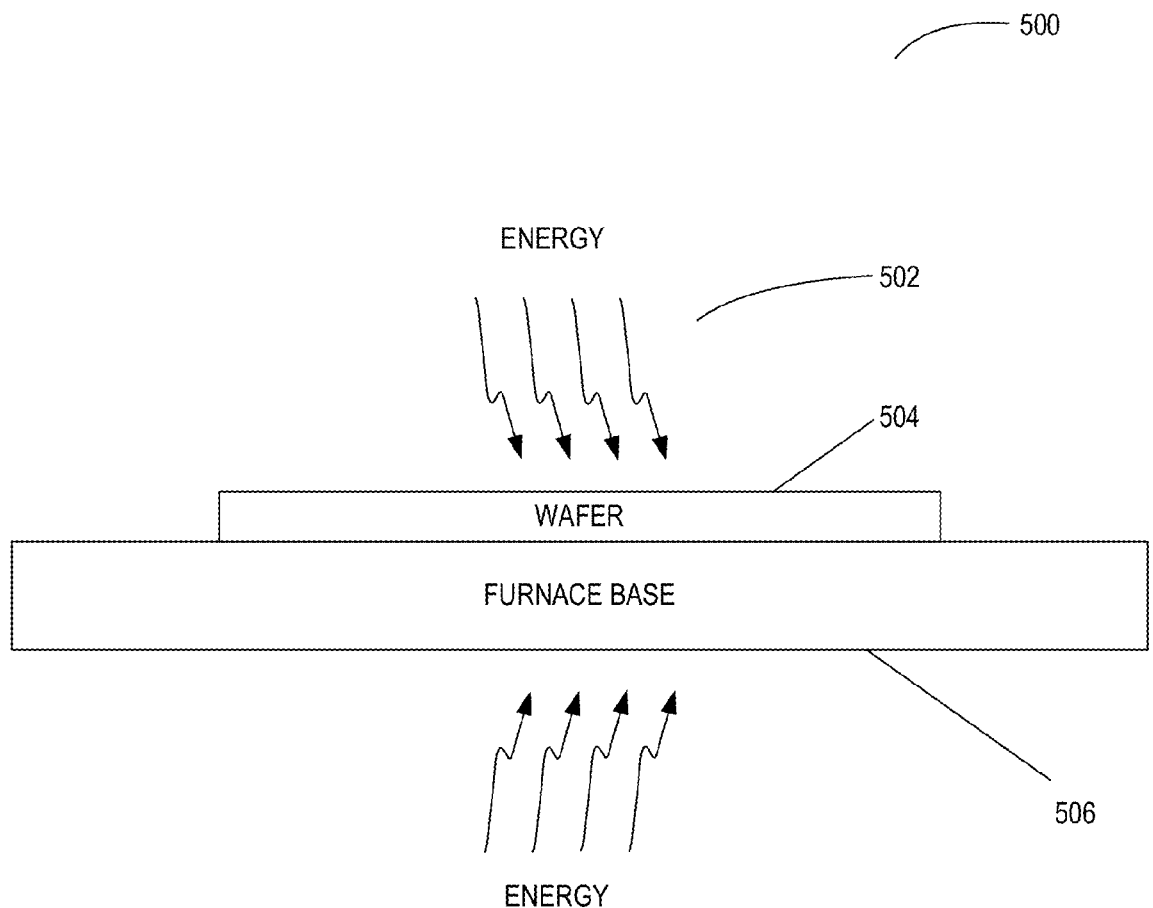
FIG. 5 is a block diagram that illustrates the configuration of certain elements for manufacturing a new material from a semiconductor material, according to one embodiment of the invention.

FIG. 5 illustrates a manufacturing configuration 500 of the energy source 502, semiconductor wafer 504, and furnace base 506 according to one embodiment of the invention. In an embodiment, semiconductor wafer 504 is placed on furnace base 506. Furnace base 506 is not limited to a single piece of material, but may comprise a composite or structure of many materials. Energy source 502 emits energy, heat or otherwise, to increase the temperature of wafer 504. The natural heat conduction properties of the semiconductor wafer and the temperature of furnace base 506 allows a top portion of wafer 504 to transform, while the bottom portion in proximity to furnace base 506 remains unaltered. In one embodiment, the temperature of the furnace base 506 is controlled.

Figure 6:
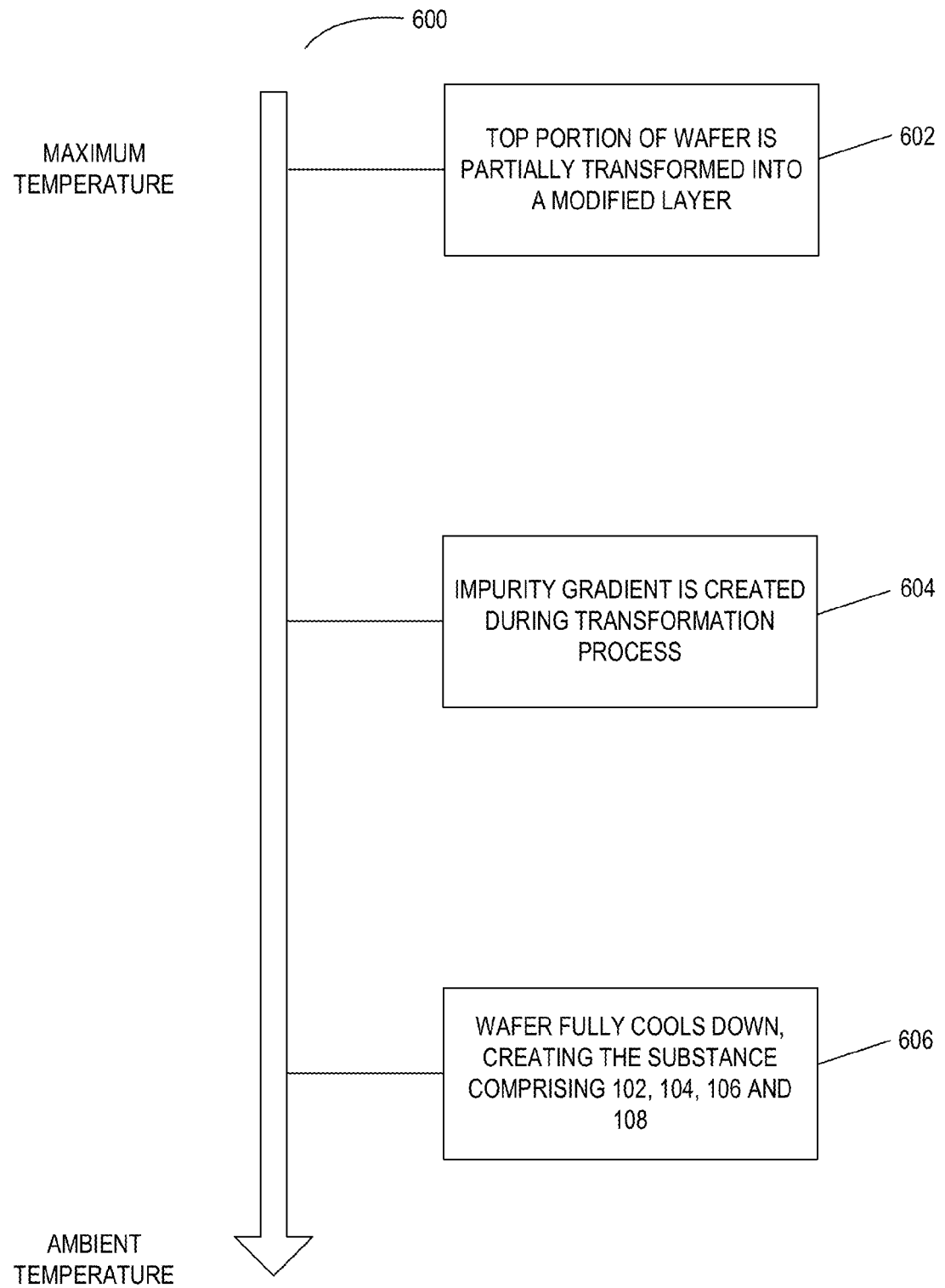
FIG. 6 is a conceptual diagram illustrating the transformation of a semiconductor material during cooling.

FIG. 6 illustrates the progression 600 of the transformation of a silicon wafer to become the new material 100 as described in reference to FIG. 1, according to one embodiment of the invention. At the maximum temperature, at stage 602, the top portion of a wafer is partially transformed. In one embodiment, the transformation creates transition layers as are described as layers 106 and 108 with reference to FIG. 1. In some embodiments, one of the transition layers is substantially equivalent to intrinsic silicon.

At stage 604, the temperature is cooler than at stage 602. At this stage of transformation of the wafer, an impurity gradient is created. For example, there is a gradient in an impurity, such as phosphorus, from the top to one or more of the transition layers. At stage 606, the wafer fully cools down and transforms into a new material, such as the new material 100 comprising portions 102, 104, 106, and 108.

Figure 7:
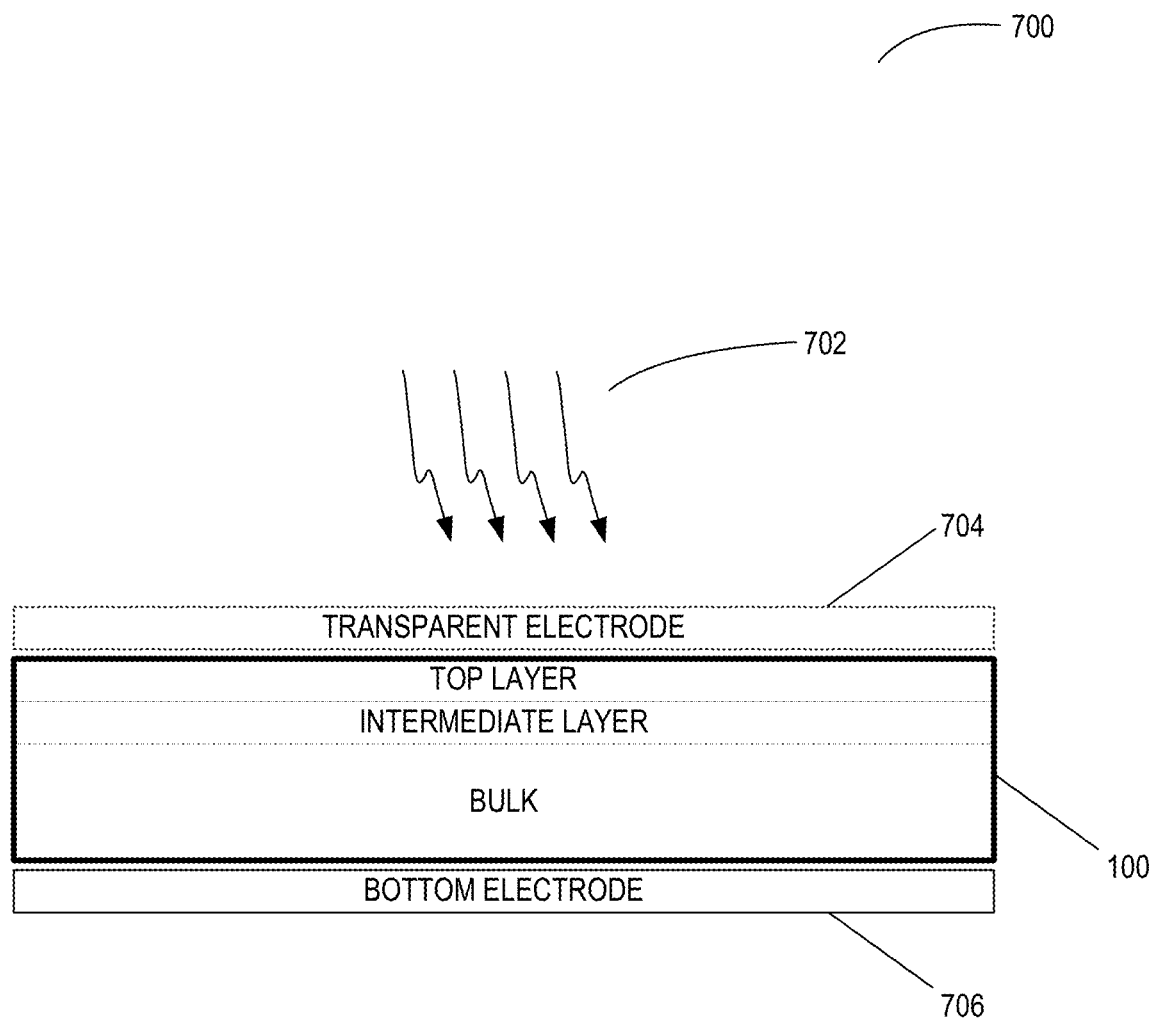
FIG. 7 is a block diagram that illustrates the new material configured within a photovoltaic cell.

FIG. 7 illustrates a block diagram of an application 700 of new material 100 in one example. Application 700 utilizes the photovoltaic properties of new material 100 as exhibited in some embodiments of the invention to create a photovoltaic cell with the new material. In this example, new material 100 is positioned between transparent electrode 704 and bottom electrode 706 to form a photovoltaic cell. Electromagnetic radiation 702 hits the surface of new material 100 causing electrons to be generated. Examples of electromagnetic radiation that can be used for inducing a photovoltaic effect in new material 100 includes but is not limited to energy from visible light and infrared light. The electrons flow into the bulk from the surface. In one example, the polarity of the intermediate layer which approximates an intrinsic semiconductor is positive, where as the bulk of n-type semiconductor is negative. In an embodiment, the differing and respective properties of the top layer, transition layers, and bulk layer of the new material 100 formed from a semiconductor wafer forms the band-gap gradient necessary to achieve a photovoltaic effect from the new material 100.

Other features, aspects and objects of the invention can be obtained from a review of the figures and the claims. It is to be understood that other embodiments of the invention can be developed and fall within the spirit and scope of the invention and claims.

The foregoing description of preferred embodiments of the present invention has been provided for the purposes of illustration and description. It is not intended to be exhaustive or to limit the invention to the precise forms disclosed. Various additions, deletions and modifications are contemplated as being within its scope. The scope of the invention is, therefore, indicated by the appended claims rather than the foregoing description. Further, all changes which may fall within the meaning and range of equivalency of the claims and elements and features thereof are to be embraced within their scope.

What is claimed is:

1. A single-piece photovoltaic material comprising:
   a bulk layer of semiconductor material;
   an intermediate layer provided over the bulk layer, the intermediate layer containing a coherent crystal structure of the bulk layer;
   a transition layer provided over the intermediate layer, the transition layer containing the coherent crystal structure of the bulk layer, whereby either of the intermediate layer or the transition layer is substantially equivalent to intrinsic silicon; and
   a top layer provided over the transition layer, the top layer comprising one or more of a crystalline structure or an amorphous structure, the top layer containing the coherent crystal structure of the bulk layer, whereby the bulk layer, the intermediate layer, the transition layer and the top layer are created by a transformative process on a single-piece semiconductor material.

2. The single-piece photovoltaic material of claim 1, wherein the transformative process is caused by performing the steps of:
exposing of a top surface of the single-piece semiconductor material to an energy source, whereby the energy source causes heating of a portion of the single-piece semiconductor material; and
ceasing exposure of the top surface of the single-piece semiconductor material to the energy source, whereby the exposing step and the ceasing step cause the single-piece semiconductor material to transform into the structure comprising the bulk layer, the intermediate, layer, the transition layer, and the top layer.

3. The single-piece photovoltaic material of claim 2, wherein the portion of the single-piece semiconductor material is heated to a temperature of at least 800 K.

4. The single-piece photovoltaic material of claim 2, wherein the steps of exposing and ceasing occurs in a vacuum.

5. The single-piece photovoltaic material of claim 2, wherein the heating of the portion occurs for a duration of 60 to 80 minutes.

6. The single-piece photovoltaic material of claim 2, wherein the step of exposing occurs until the top surface of the single-piece semiconductor material reaches a target temperature, after which the ceasing step begins.

7. The single-piece photovoltaic material of claim 1, wherein the single-piece semiconductor material is an n-type silicon, the n-type silicon having an impurity of phosphorus.

8. The single-piece photovoltaic material of claim 1, wherein the single-piece semiconductor material has a thickness of 0.1 to 10 μm.

9. The single-piece photovoltaic material of claim 1, further comprising a top surface that is porous.

10. The single-piece photovoltaic material of claim 1, wherein the single-piece photovoltaic material produces photovoltaic effects when exposed to light.

11. The single-piece photovoltaic material of claim 1, wherein each of the bulk layer, intermediate layer, transition layer, and top layer have different ranges of resistivity.

12. A photovoltaic device using the single-piece photovoltaic material according to claim 1, the photovoltaic device comprising:
the single-piece photovoltaic material;
a bottom electrode provided under the single-piece photovoltaic material; and
a top electrode provided over the single-piece photovoltaic material.

13. A method for manufacturing a single-piece photovoltaic, comprising transformative process that is caused by performing the steps of:
exposing of a top surface of a single-piece semiconductor material to an energy source, whereby the energy source causes heating of a portion of the single-piece semiconductor material; and
ceasing exposure of the top surface of the single-piece semiconductor material to the energy source, whereby the exposing step and the ceasing step cause the single-piece semiconductor material to transform into a structure comprising:
a bulk layer of the semiconductor material;
an intermediate layer provided over the bulk layer, the intermediate layer containing a coherent crystal structure of the bulk layer;
a transition layer provided over the intermediate layer, the transition layer containing the coherent crystal structure of the bulk layer, whereby either of the intermediate layer or the transition layer is substantially equivalent to intrinsic silicon; and
a top layer provided over the transition layer, the top layer comprising one or more of a crystalline structure or an amorphous structure, the top layer containing the coherent crystal structure of the bulk layer.

14. The method of claim 13, wherein the portion of the single-piece semiconductor material is heated to a temperature of at least 800 K.

15. The method of claim 13, wherein the steps of exposing and ceasing occur in a vacuum.

16. The method of claim 13, wherein the heating of the portion occurs for a duration of 60 to 80 minutes.

17. The method of claim 13, wherein the step of exposing occurs until the top surface of the single-piece semiconductor material reaches a target temperature, after which the ceasing step begins.

18. The method of claim 13, wherein the single-piece semiconductor material is an n-type silicon, the n-type silicon having an impurity of phosphorus.

19. The method of claim 13, wherein the single-piece semiconductor material has a thickness of 0.1 to 10 μm.

20. The method of claim 13, further comprising a top surface that is porous.

21. The method of claim 13, wherein the single-piece photovoltaic material produces photovoltaic effects when exposed to light.

22. The method of claim 13, wherein each of the bulk layer, intermediate layer, transition layer, and top layer have different ranges of resistivity.

23. A single-piece photovoltaic material comprising:
a bulk layer of an n-type silicon wafer;
an intermediate layer provided over the bulk layer, the intermediate layer containing a coherent crystal structure of the bulk layer;
a transition layer provided over the intermediate layer, the transition layer containing the coherent crystal structure of the bulk layer, whereby either of the intermediate layer or the transition layer is substantially equivalent to intrinsic silicon; and
a top layer provided over the transition layer, the top layer comprising one or more of a crystalline structure or an amorphous structure, the top layer containing the coherent crystal structure of the bulk layer,
whereby the bulk layer, the intermediate layer, the transition layer and the top layer are created by a transformative process caused by performing the steps of:
exposing of a top surface of a single-piece semiconductor material to an energy source, whereby the energy source causes heating of a portion of the single-piece semiconductor material to a temperature of at least 800 K, wherein the steps of exposing and ceasing occur in a vacuum; and
ceasing exposure of the top surface of the single-piece semiconductor material to the energy source, whereby the exposing step and the ceasing step cause the single-piece semiconductor material to transform into a structure.

* * * * *